United States Patent
Murayama et al.

(10) Patent No.: US 10,277,026 B2
(45) Date of Patent: Apr. 30, 2019

(54) POWER CONVERTER

(71) Applicant: KABUSHIKI KAISHA TOSHIBA, Minato-ku (JP)

(72) Inventors: Hiroki Murayama, Minato-ku (JP); Naoto Shinohara, Minato-ku (JP); Daisuke Yamagishi, Minato-ku (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 15/938,265

(22) Filed: Mar. 28, 2018

(65) Prior Publication Data
US 2018/0219370 A1    Aug. 2, 2018

Related U.S. Application Data

(63) Continuation of application No. PCT/JP2016/077658, filed on Sep. 20, 2016.

(30) Foreign Application Priority Data

Sep. 30, 2015  (JP) .................................. 2015-193655

(51) Int. Cl.
*H02H 7/12* (2006.01)
*H02M 7/48* (2007.01)
(Continued)

(52) U.S. Cl.
CPC ............ *H02H 7/1213* (2013.01); *H02H 7/12* (2013.01); *H02M 3/156* (2013.01);
(Continued)

(58) Field of Classification Search
CPC .... H02H 7/1213; H02H 7/122; H02H 7/5387; H02H 7/53871; H02H 7/1222; H02H 7/1227; H02M 1/32; H02M 1/34
(Continued)

(56) References Cited

U.S. PATENT DOCUMENTS 4,633,381 A * 12/1986 Upadhyay ............... H02M 1/38
                                                     363/132
4,636,929 A *  1/1987 Nakamura ......... G01R 19/1658
                                                     363/132
(Continued)

FOREIGN PATENT DOCUMENTS

JP     2005-45914      2/2005
JP    2007-252134      9/2007
(Continued)

OTHER PUBLICATIONS

International Search Report dated Oct. 25, 2016 in PCT/JP2016/077658, filed on Sep. 20, 2016.

*Primary Examiner* — Nguyen Tran
(74) *Attorney, Agent, or Firm* — Oblon, McClelland, Maier & Neustadt, L.L.P.

(57) ABSTRACT

A power converter connected between a direct current power supply and a load, the power converter including a switching unit energizing the load based on inputted control signal, a voltage detector detecting a voltage of the direct current power supply, and a protection operation portion detecting a steep elevation of the voltage and performing protection operation to stop a switching operation by the switching unit, wherein the protection operation portion includes an addition circuit adding a predetermined voltage to the voltage detected by the voltage detector and a delay time generator connected to an output of the addition circuit, and wherein the protection operation is performed when a difference between the voltage detected by the voltage detector and an output voltage of the delay time generator reaches a certain value.

12 Claims, 14 Drawing Sheets

(51) Int. Cl.
*H02M 3/156* (2006.01)
*H02M 3/338* (2006.01)
*H02M 7/54* (2006.01)
*H03K 17/284* (2006.01)
*H02M 1/00* (2006.01)

(52) U.S. Cl.
CPC ........... *H02M 3/3388* (2013.01); *H02M 7/48* (2013.01); *H02M 7/54* (2013.01); *H03K 17/284* (2013.01); *H02M 2001/0032* (2013.01)

(58) Field of Classification Search
USPC ............. 363/50, 55, 56.01–58; 323/299, 906
See application file for complete search history.

(56) References Cited

U.S. PATENT DOCUMENTS

2014/0092655 A1    4/2014  Igarashi et al.
2015/0263624 A1*   9/2015  Nobe .................... H02M 1/32
                                                      323/299

FOREIGN PATENT DOCUMENTS

| JP | 2010-136506    | 6/2010  |
| JP | 2011-64559     | 3/2011  |
| JP | 2013-74769     | 4/2013  |
| JP | 2013-251981    | 12/2013 |
| WO | WO 2012/077187 A1 | 6/2012 |

\* cited by examiner

POWER CONVERTER

CROSS-REFERENCE TO RELATED APPLICATION(S)

This application is a continuation to an International Application No. PCT/JP2016/077658, filed on Sep. 20, 2016 which is based upon and claims the benefit of priority from Japanese Patent Application No. 2015-193655, filed on, Sep. 30, 2015, the entire contents of which are incorporated herein by reference.

FIELD

Embodiments of the invention disclosed herein relate a power converter.

BACKGROUND

For example, an inverter that drives a three-phase brushless motor or a converter that converts direct current voltage perform power conversion by connecting a switching unit to a direct current power supply and turning switching elements on and off. A battery such as a lithium ion battery or a rectified and smoothened commercial alternating power supply converted into stabilized voltage for example are used as the direct current power supply.

Such direct current power supply experiences a voltage variation of approximately 20% of the reference voltage depending upon the charging/discharging state of the battery or by variation of commercial alternating current power supply, etc. Thus, in order to protect circuit elements from overvoltage, an overvoltage protection circuit is implemented to the switching unit. In the overvoltage protection circuit, it is widely accepted to employ a configuration in which, for example, a voltage value of the direct current power supply is compared with a threshold value for judging occurrence of overvoltage by using a comparator and a predetermined protection operation is performed when the voltage value exceeds the threshold value.

Elements such as a low-pass filter having a cutoff frequency lower than the operating frequency of the switching unit is often connected to the circuit detecting the direct current voltage. This is because a steep voltage change does not occur in normal operation and a filter with a large time constant is connected to deal with noise. Elements such as an isolation amplifier unsuitable for high speed operation are also connected in order to insulate the main circuit from the control circuit in consideration of safety and reliability. Thus, a direct current voltage detection circuit generally has poor responsiveness and the overvoltage protection operation may be delayed on the order of several tens of µs to several hundreds of µs with respect to a high slew rate voltage change caused by external factors. Thus, in consideration of the responsiveness of the detection circuit, a configuration to limit the operation of the switching unit by operating ahead of the protection threshold value of the overvoltage protection circuit is proposed as disclosed in JP 2010-136506 A which is a published Japanese patent application.

SUMMARY

Problem Solved

However, in the configuration disclosed in the above described publication, when the inductance of the reactor connected to the output side of the switching unit is extremely large, large electric power may be regenerated to the direct current power supply side at the time of protection operation to cause an instantaneous voltage elevation and may result in application of voltage exceeding the device rating before the overvoltage protection operation becomes valid. Especially when a power generator or the like is connected as the load of the switching unit, excessively large regenerative electric power is produced by magnetic energy. It is thus, not possible to limit the direct current voltage within the device rating voltage by merely restricting the operation of the switching unit. It is therefore, required to take measures such as increasing the capacitance of a smoothening capacitor.

Thus, a power converter is provided that possess a high speed overvoltage protection function capable of suppressing the direct current voltage within the device rating voltage even when excessively large electric power is regenerated from the output side.

Solution To Problem

A power converter connected between a direct current power supply and a load includes a switching unit energizing the load based on an inputted control signal, a voltage detector detecting a voltage of the direct current power supply, and a protection operation portion detecting a steep elevation of the voltage and performing protection operation to stop a switching operation of the switching unit, wherein the protection operation portion includes an addition circuit adding a predetermined voltage to the voltage detected by the voltage detector and a delay time generator connected to an output of the addition circuit, and wherein the protection operation is performed when a difference between the voltage detected by the voltage detector and an output voltage of the delay time generator reaches a certain value.

DESCRIPTION

First Embodiment

Figure 1:
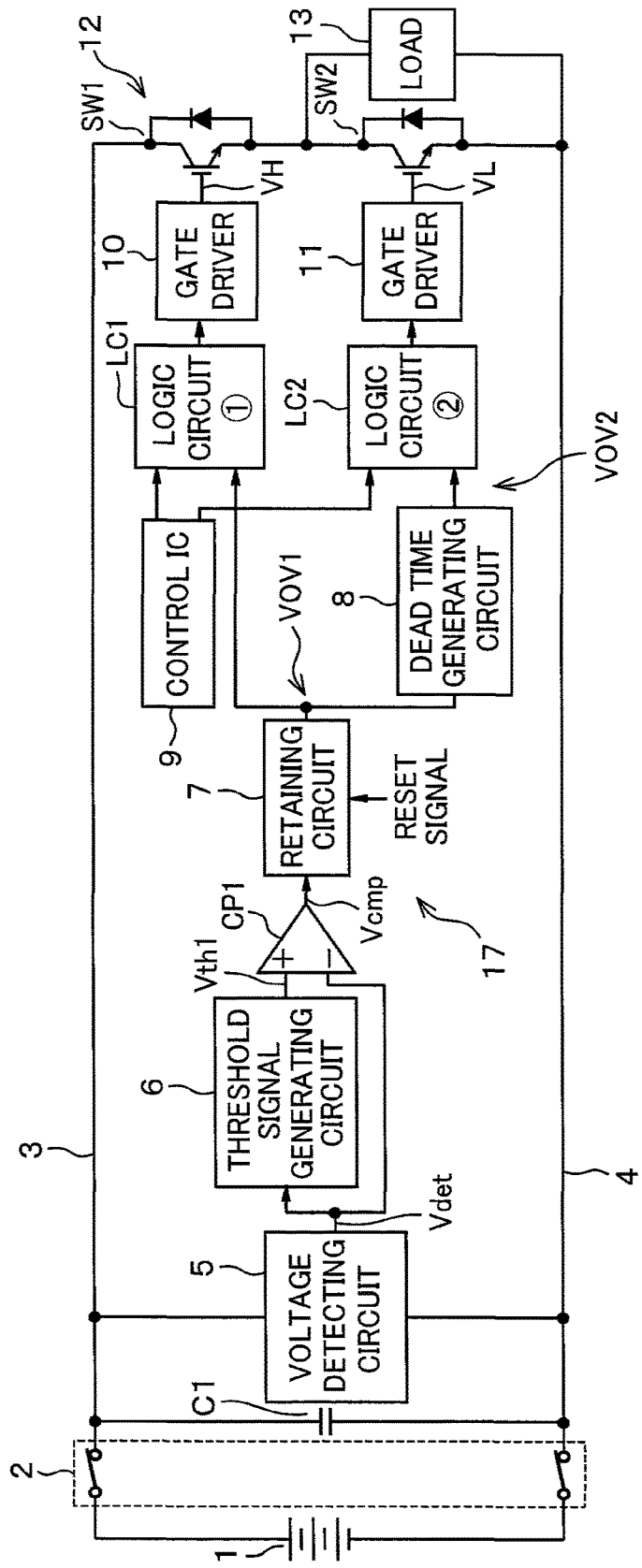
FIG. 1 pertains to a first embodiment and illustrates a switching unit and its protection circuit.

A description will be given hereinafter on a first embodiment with reference to FIGS. 1 to 4. FIG. 1 illustrates a switching unit and its protection circuit. Two ends of a direct current power supply 1 are connected to power supply lines 3 and 4 via a relay switch 2. A smoothening capacitor C1 and a voltage detection circuit 5 are connected between the power supply lines 3 and 4. The voltage detection circuit 5 corresponds to a voltage detector.

The voltage detection circuit 5 is provided with a voltage dividing circuit, a differential circuit, and the like, not specifically shown. The voltage detection circuit 5 detects the direct current voltage between the power supply lines 3 and 4 and outputs a detection signal Vdet to a threshold signal generating circuit 6 and an inverting input terminal of a comparator CP1. The threshold signal generating circuit 6 generates a threshold signal Vth1 based on the inputted detection signal Vdet and outputs the threshold signal vth1 to the noninverting input terminal of the comparator CP1.

The comparator CP1 compares the detection signal Vdet and the threshold signal Vth and outputs a low active overvoltage judging signal Vcmp (trigger signal) to a retaining circuit 7. The retaining circuit 7 outputs an interruption signal V0V1 that retains the state of change of the signal Vcmp. The interruption signal V0V1 is directly inputted to a logic circuit LC1 and is further inputted to a logic circuit LC2 after being transformed to an inverted interruption signal V0V2 through a dead time generating circuit 8.

A drive control signal is inputted to the logic circuits LC1 and LC2 by a control IC 9. The logic circuits LC1 and LC2 correspond to a logic operator. The logic circuits LC1 and LC2 output signals obtained by logically synthesizing the drive control signal and interruption signals V0V1 and V0V2 to the gates of semiconductor switching elements SW1 and SW2 via gate drivers 10 and 11. The switching elements SW1 and SW2 are IGBTs for example and are series connected between the power supply lines 3 and 4 to constitute a switching unit 12. A load 13 is connected parallel with the switching element SW2.

Figure 2:
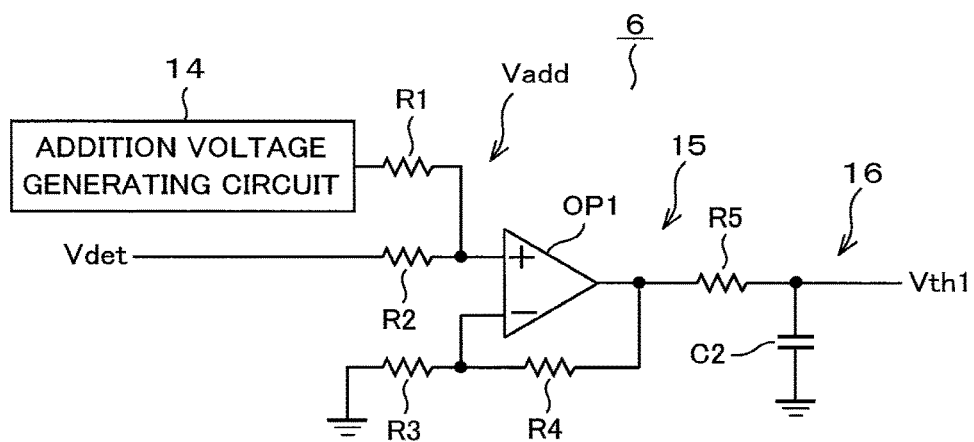
FIG. 2 illustrates a specific configuration of the protection circuit.

As illustrated in FIG. 2, in the threshold signal generating circuit 6, an addition signal Vadd generated by an addition voltage generating circuit 14 is given to the noninverting input terminal of an operational amplifier OP1 via a resistor element R1. The detection signal Vdet is further given to the noninverting input terminal via a resistor element R2. A series circuit of resistor elements R4 and R3 is connected between the output terminal of the operational amplifier OP1 and ground. A common connection point of the resistor elements R4 and R3 is connected to the inverting input terminal of the operational amplifier OP1. These elements constitute an addition circuit 15 and the addition circuit 15 adds the detection signal Vdet and the addition signal Vadd and outputs the sum.

A delay time generator 16 formed of a resistor element R5 and a capacitor C2 is connected to the output terminal of the addition circuit 15. A delay time based on time constant z is given to the input signal (Vdet+Vadd) by the delay time generator 16. The signal outputted from the delay time generator 16 is the threshold signal Vth1. The delay time generator 16 corresponds to an integration circuit. The voltage detection circuit 5, the threshold signal generating circuit 6, the comparator CP1, the retaining circuit 7, and the logic circuits LC1 and LC2 described above constitute a protection circuit 17. The protection circuit 17 corresponds to a protection operation portion.

Figure 3:
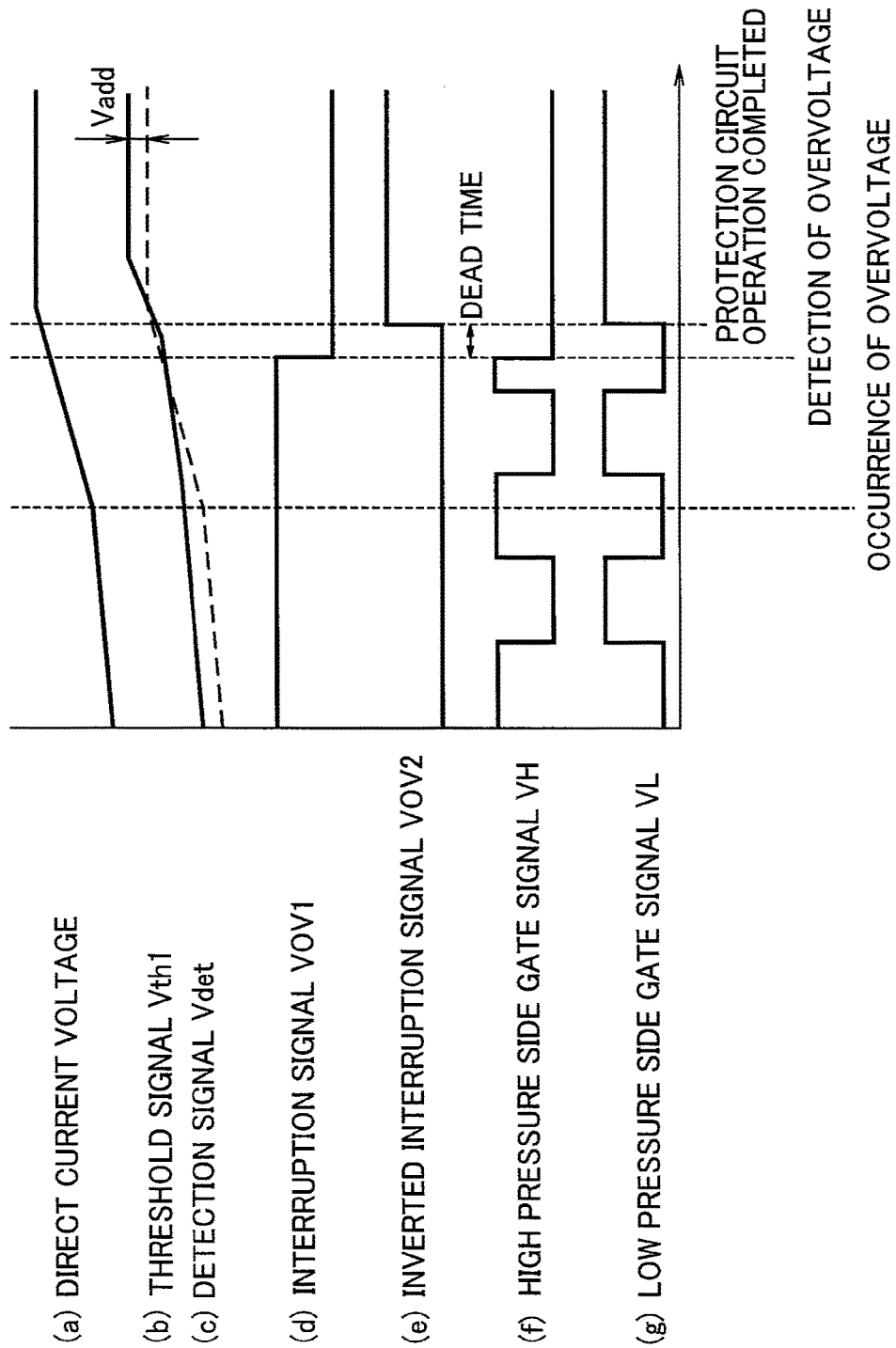
FIG. 3 is a timing chart illustrating the case in which the protection circuit operates in the first embodiment.

Next, a description will be given on the operation of the present embodiment with reference to FIGS. 3 and 4. As illustrated in FIG. 3, the voltage of the threshold signal Vth1 is higher than the voltage of the detection signal Vdet by the amount of addition signal Vadd and the change in the voltage of the threshold signal Vth1 is delayed by time constant τ. When overvoltage occurs between the power supply lines 3 and 4, difference is created in the magnitudes of voltage elevation of the detection signal Vdet and the threshold signal Vth1 and thus, the detection signal Vdet becomes temporarily greater than the threshold signal Vth1 (Vdet≥Vth1) (see (a) to (C)). As a result, the comparator CP1 outputs overvoltage judging signal Vcmp and the overvoltage judging signal Vcmp is retained as the interruption signal V0V1 by the retainer circuit 7 (see (d)).

The signal retaining circuit 7 is preferably a circuit such as a latch circuit capable of resetting the retaining state of the signal V0V1 by an external signal inputted by the control IC 9 for example. By employing such configuration, it is possible to disable the operation of the protection circuit 17 by a reset signal while an electric vehicle is undergoing rapid battery charge for example. Alternatively, a timer may be activated from the moment the overvoltage judging signal Vcmp becomes active and the retaining state may be reset after lapse of a certain time for example.

When the interruption signal V0V1 is outputted, the inverted signal V0V2 of the signal V0V1 is outputted (see (e)) after the lapse of the delay time given by the dead time generating circuit 8. The delay time provides a dead time in which both the switching elements SW1 and SW2 are turned OFF and is approximately several μs for example.

The signals V0V1 and V0V2 interrupt the drive control signals of the switching elements SW1 and SW2 in the logic circuits LC1 and LC2 and protect the circuit from overvoltage by fixing the ON/OFF states of the switching elements SW1 and SW2 to predetermined states. For example, in case of an overvoltage caused by a load dump during regeneration, switching element SW1 in the high pressure side is turned OFF and the switching element SW2 in the low pressure side is thereafter turned ON (see (f), (g)) to form a short circuit loop with the load 13 and the switching unit 12 and provide protection by consuming electric power.

That is, the protection circuit 17 of the present embodiment detects overvoltage at high speed based on the difference in the voltage change rates of the detection signal Vdet and the threshold signal Vth1. The response properties of the protection circuit 17 may be changed arbitrarily by the time constant τ and the addition signal Vadd used in the generation of the threshold signal Vth1. Further, the addition signal Vadd may be readily modified to voltage dividing resistance or microcomputer output and the time constant τ may be readily modified to RC time constant depending upon the device being used.

Figure 4:
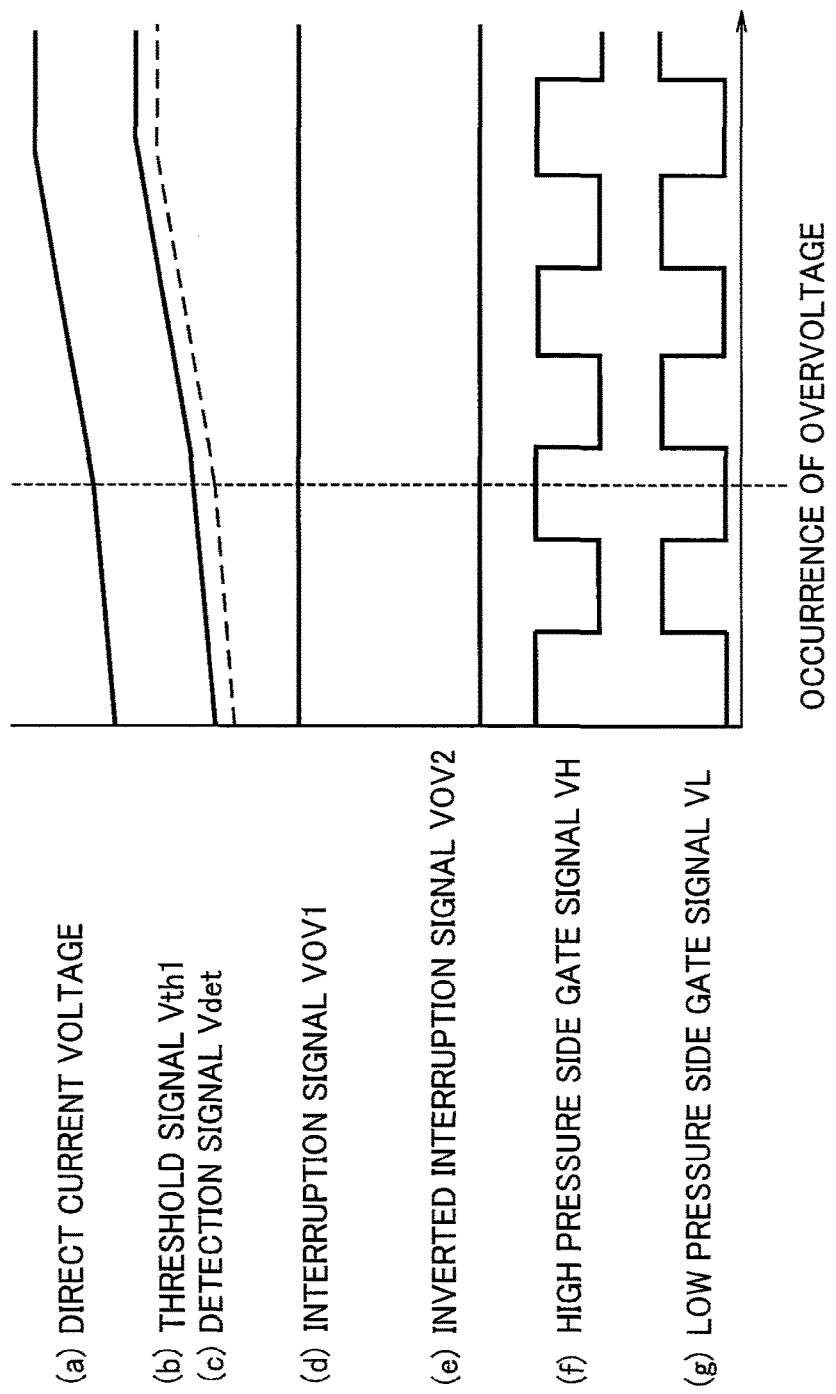
FIG. 4 is a timing chart illustrating the case in which the protection circuit dues not operate in the first embodiment.

Further, in case the voltage between the power supply lines 3 and 4 does not undergo a steep elevation in a magnitude to exceed the device breakdown voltage, the protection circuit 17 does not operate since the size relation of the detection signal Vdet and the threshold signal Vth1 is maintained as illustrated in FIG. 4.

According to the present embodiment described above, with respect to the switching unit 12 that is connected between the direct current power supply 1 and the load 13 and that energizes the load 13 based on the inputted control signal, the protection circuit 17 detects a steep voltage elevation of the direct current power supply 1 detected by the voltage detection circuit 5 and executes a protection operation to stop the switching operation by the switching unit 12. The protection circuit 17 is provided with the addition circuit 1.5 that adds the addition signal Vadd to the detection signal Vdet and the delay time generator 16 connected to the output of the addition circuit 15. The protection circuit 17 executes a protection operation when the difference between the detection signal Vdet and the threshold signal Vth1 which is an output voltage of the integration circuit and which is given the time constant τ reaches a certain value.

According to the above described configuration, it is possible to detect a steep overvoltage without measuring the time using a timer or the like and thereby allowing the size and cost of the protection circuit 17 to be reduced compared to conventional protection circuits because the protection circuit 17 compares the detection signal Vdet and the threshold signal Vth1 using a comparator CP1, it is possible to rapidly detect indications leading to overvoltage.

Further, the switching unit 12 is configured by two switching elements SW1 and SW2 connected parallel to the direct current power supply 1 and the protection circuit 17 causes the switching unit 12 to short circuit the load 1 as a protection operation. Thus, in case the load 13 is a stator winding of a motor for example, the rotation of the motor may be stopped by short circuit braking.

Further, the protection circuit 17 is provided with logic circuits LC1 and LC2 that generate a drive signal for the switching unit 12 by performing a logical operation of the drive control signal given by the control IC 9 and interruption signals V0V1 and V0V2 which are based on the overvoltage judging signal Vcmp generated for performing the protection operation, and the logic circuits LC1 and LC2 execute the protection operation with priority over the drive control signal. It is thus, possible to rapidly stop the switching operation of the switching unit 12 when detecting an indication leading to overvoltage.

Second Embodiment

Figure 5:
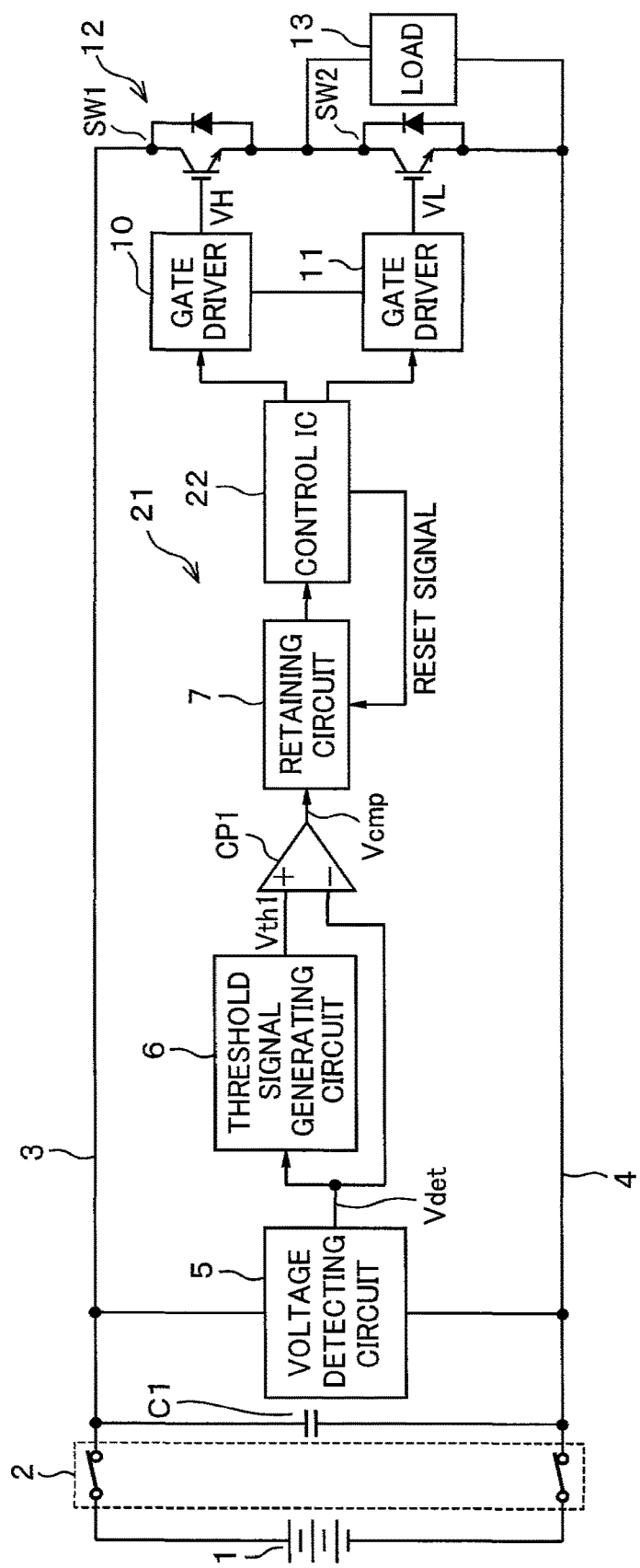
FIG. 5 pertains to a second embodiment and illustrates the switching unit and its protection circuit.

In the following description, elements that are identical to those of the first embodiment are identified with identical reference symbols and are not re-described. A description will be given on the differences from the first embodiment. As illustrated in FIG. 5, the dead time generating circuit 8 and the logic circuits LC1 and LC2 are removed from a protection circuit 21 of the second embodiment and the interruption signal V0V1 outputted by the retaining circuit 7 is inputted to a control IC 22 replacing the control IC 9. That is, in the second embodiment, the control 22 performs the operation indicated in FIG. 3 instead of the circuitry it replaces.

When the interruption signal V0V1 is inputted, the control IC 22 performs a protection operation as illustrated in FIG. 3 by fixing a gate signal VH to low level and thereafter fixing a gate signal VL to high level after the lapse of dead time. In the second embodiment, generation of the dead time and the interruption to the drive control signal are controlled by the software of the control IC 22 and thus, it is possible to reduce the circuit size though the response speed is reduced.

Third Embodiment

Figure 6:
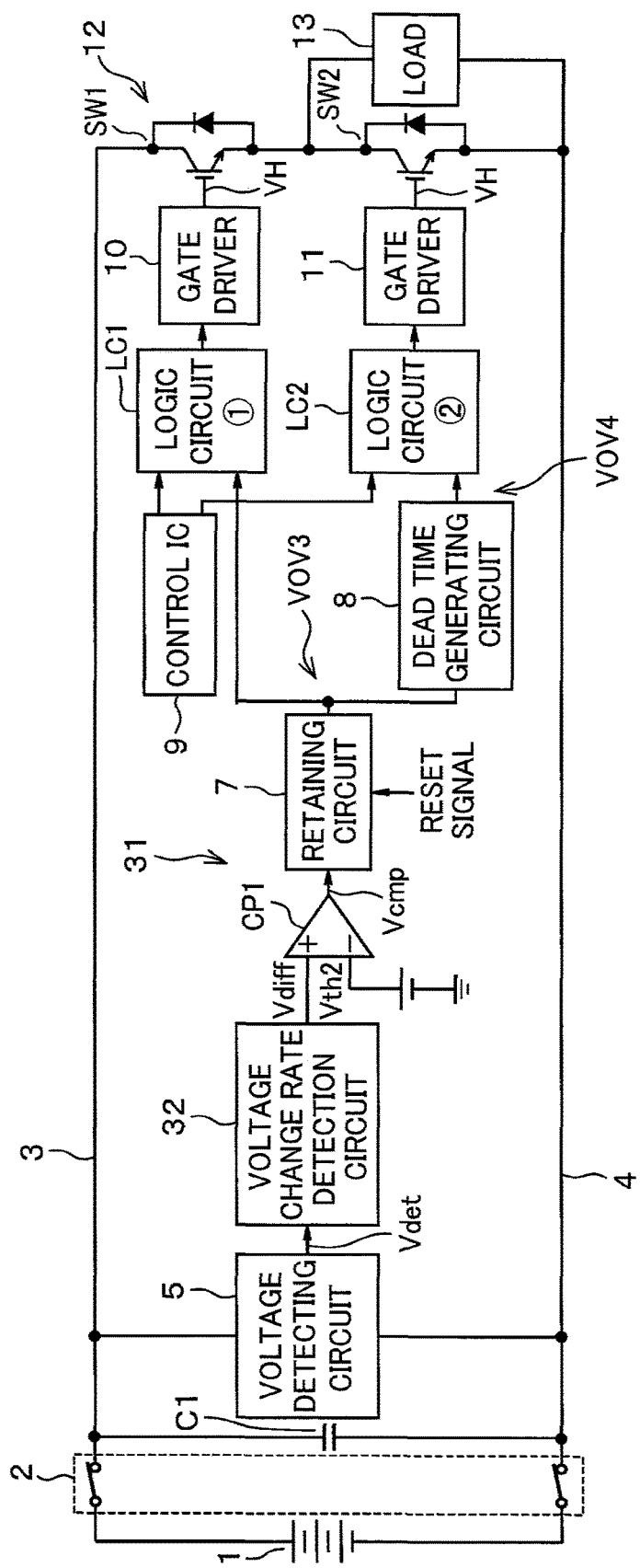
FIG. 6 pertains to a third embodiment and illustrates the switching unit and its protection circuit.
Figure 7:
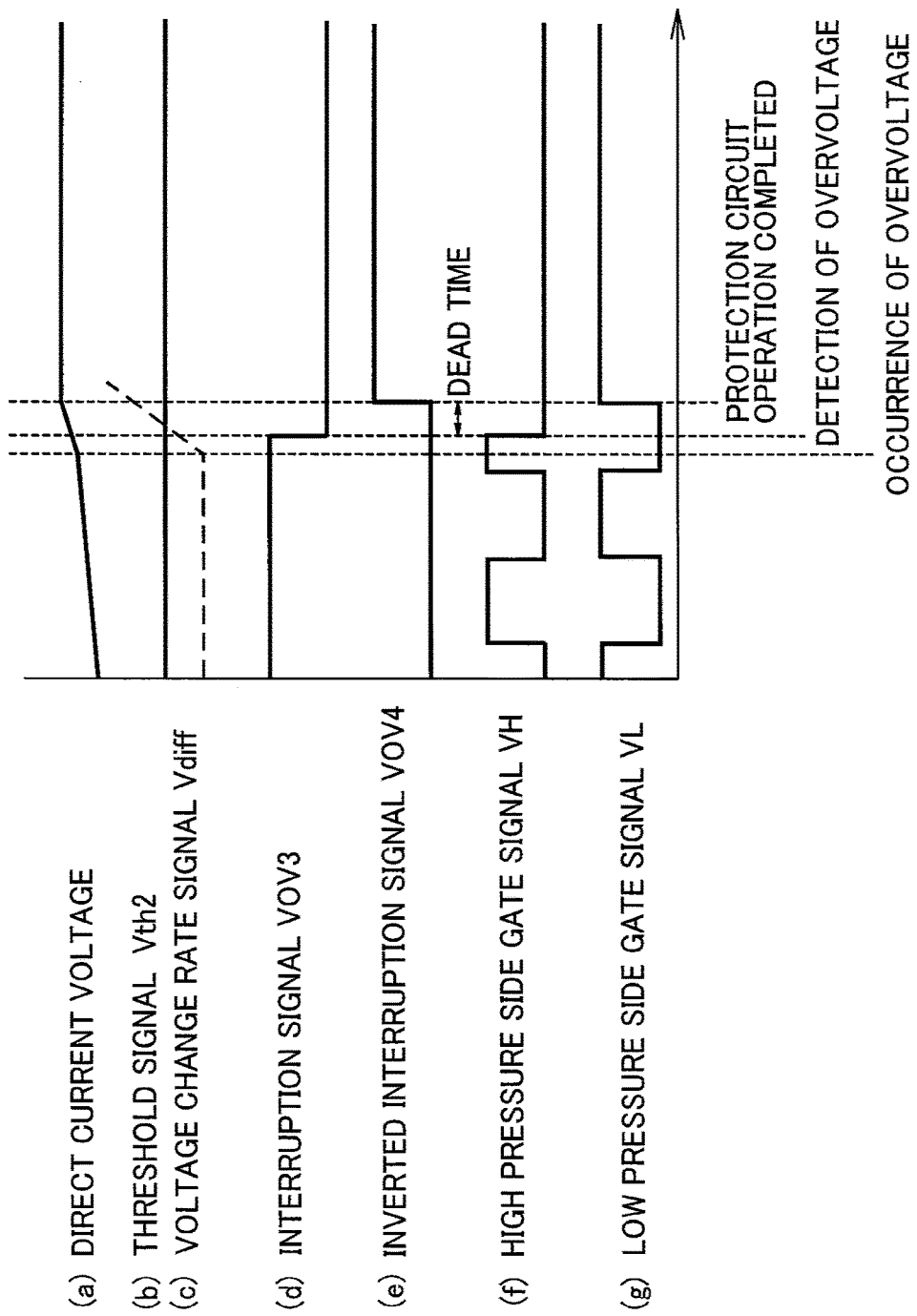
FIG. 7 is an operation timing chart according to the third embodiment.

Next, a description will be given on a third embodiment with reference to FIGS. 6 and 7. A protection circuit 31 of the third embodiment is provided with a voltage change rate detection circuit 32 configured by a differentiation circuit for example instead of the threshold signal generating circuit 6. A voltage change rate signal Vdiff outputted from the voltage change rate detection circuit 32 is given to the noninverting input terminal of the comparator CP1 and a threshold signal Vth2 is given to the inverting input terminal of the comparator CP1.

Next, a description will be given on the operation of the third embodiment with reference to FIG. 7. When the voltage of the direct current power supply 1 elevates suddenly, the voltage change is detected by the voltage chance rate detection circuit 32 and the level of voltage change rate signal Vdiff is increased (see (a) and (c)). When the voltage change rate signal Vdiff exceeds he threshold signal Vth2 (see (b)), the comparator CP1 outputs the overvoltage judging signal Vcmp which is retained as an interruption signal V0V3 by the retaining circuit 7 (see (d)). When the interruption signal V0V3 is outputted, its inverted signal V0V4 is outputted (see (e)) after the lapse of the delay time given by the dead time generating circuit 8. The rest of the operation is the same as the first embodiment.

In the third embodiment, the voltage change rate is detected directly by the differentiation circuit. Thus, protection can be provided at the same time as the occurrence of overvoltage. However, in devices heavily affected by noise, surge noise or the like may increase the differentiation value of the voltage change and cause the protection circuit 31 to be operated. Thus, the use of the protection circuit 17 of the first embodiment is considered to be appropriate especially when the influence of noise is large.

Fourth Embodiment

Figure 8:
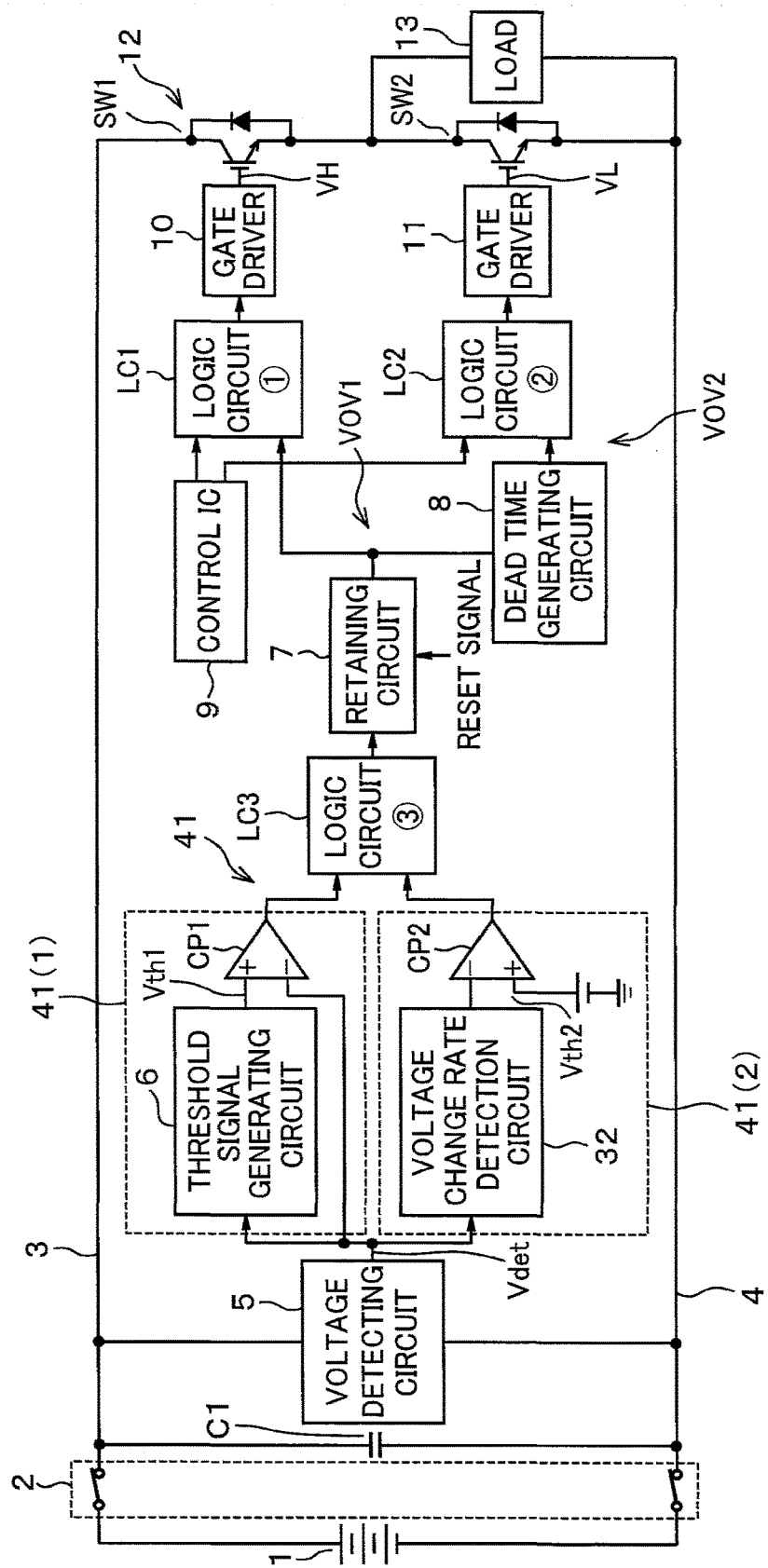
FIG. 8 pertains to a fourth embodiment and illustrates the switching unit and its protection circuit.

Next, a description will be given on a fourth embodiment with reference to FIGS. 8 and 9. As illustrated in FIG. 8, a protection circuit 41 of the fourth embodiment is provided with both the threshold signal generating circuit 6 of the first embodiment and the voltage change rate detection circuit 32 of the third embodiment and a comparator CP2 is disposed in the voltage change rate detection circuit 32 side. The output signals Vcmp1 and Vcmp2 of the comparators CP1 and CP2 are each inputted to a logic circuit LC3.

Next, a description will be given on the operation of the fourth embodiment with reference to FIG. 9. It is assumed that the threshold signal generating circuit 6 side is the protection circuit portion 41(1) and the voltage change rate detection circuit 32 side is the protection circuit 41(2). FIG. 9 illustrates the range of voltage elevation speed which can be responded by each of the protection circuit portions 41(1) and 41(2). When an overvoltage occurs, the protection circuit portion 41(1) compares the threshold signal Vth1 and detection signal Vdet and outputs the overvoltage detection signal Vcmp1 as described in the first embodiment. The protection circuit portion 41(2) compares the threshold signal Vth2 and the voltage change rate signal Vdiff and outputs the overvoltage detection signal Vcmp2 as described in the third embodiment.

Figure 9:
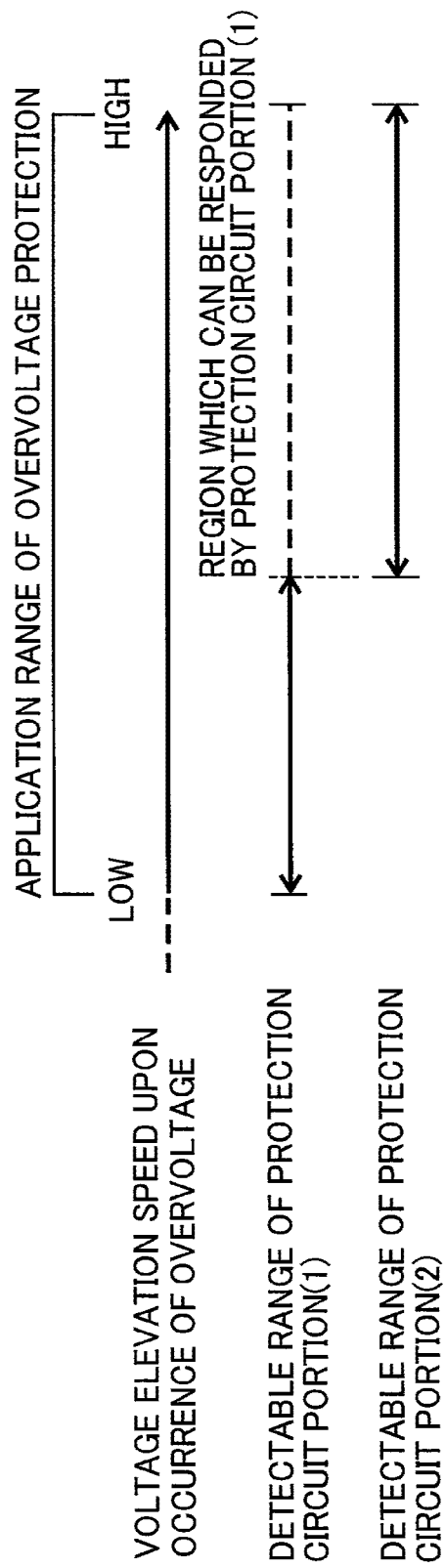
FIG. 9 is a chart indicating a voltage elevating speed to which two protection circuit portions are capable of responding.

For example, when the logic circuit LC3 is configured by an OR gate, it is possible to choose which circuit to respond with depending upon the voltage elevation rate as illustrated in FIG. 9. When the voltage elevation rate is large, the protection operation may be performed by the protection circuit portion 41(2) which is advantageous in terms of response speed. When the voltage elevation rate is small, the protection operation may be performed by the protection circuit portion 41(1) which is noise tolerant.

According to the protection circuit 31 of the third embodiment, the protection operation can be performed at higher speed compared to the first embodiment. However, in devices such as power electric devices that handle large electric power and therefore have high noise level, the protection circuit 31 may malfunction by the surge voltage generated at the time of switching. Thus, by employing the configuration of the fourth embodiment, it is possible to secure reliability even under an environment with high noise level. Further, in the configuration of the fourth embodiment, it is possible to improve the noise tolerance of the protection circuit portion 41(2) by increasing the threshold Vth2 of the differentiation circuit, thereby allowing the detection accuracy to be improved as well.

Fifth Embodiment

Figure 10:
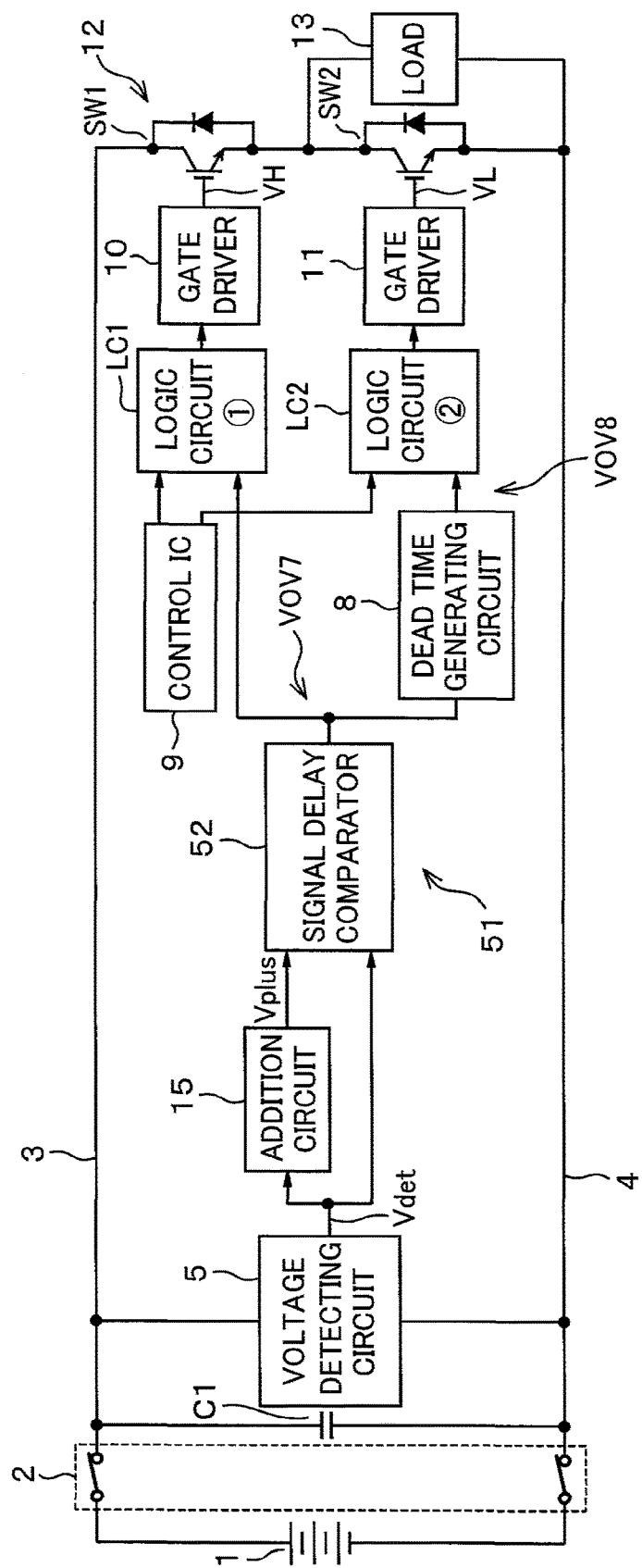
FIG. 10 pertains to a fifth embodiment and illustrates the switching unit and its protection circuit.
Figure 11:
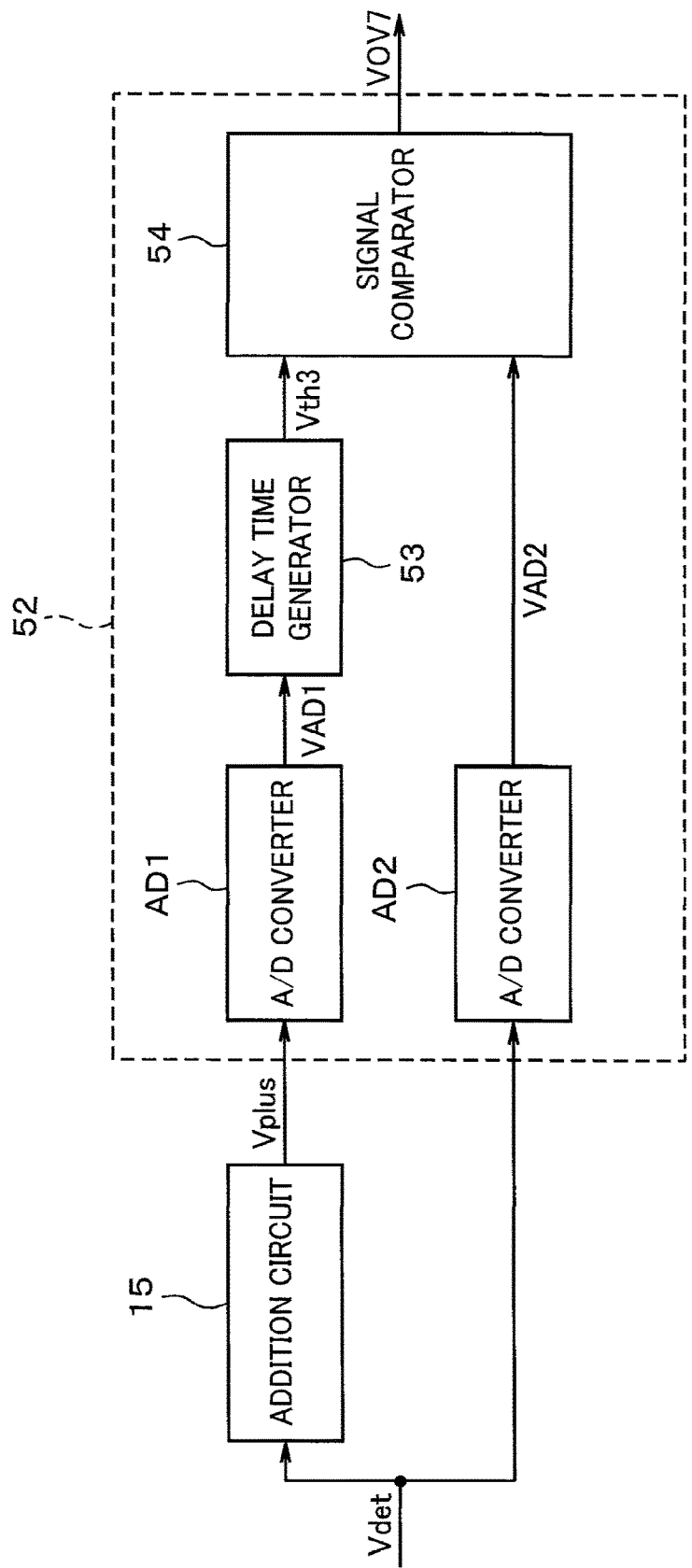
FIG. 11 pertains to the fifth embodiment and illustrates an example of a configuration of an overvoltage detection circuit.
Figure 12:
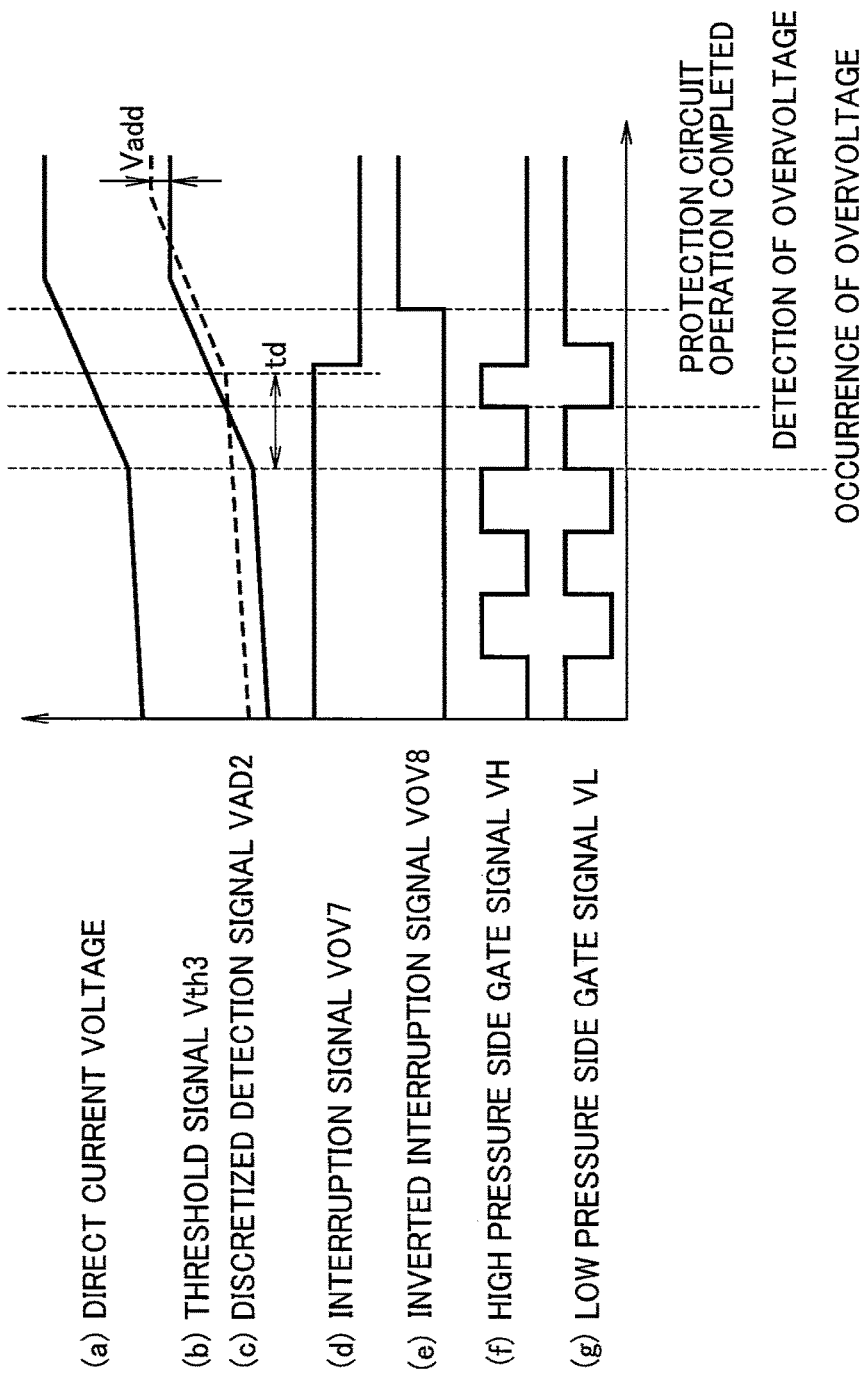
FIG. 12 is a timing chart illustrating the case in which the protection circuit operates in the fifth embodiment.
Figure 13:
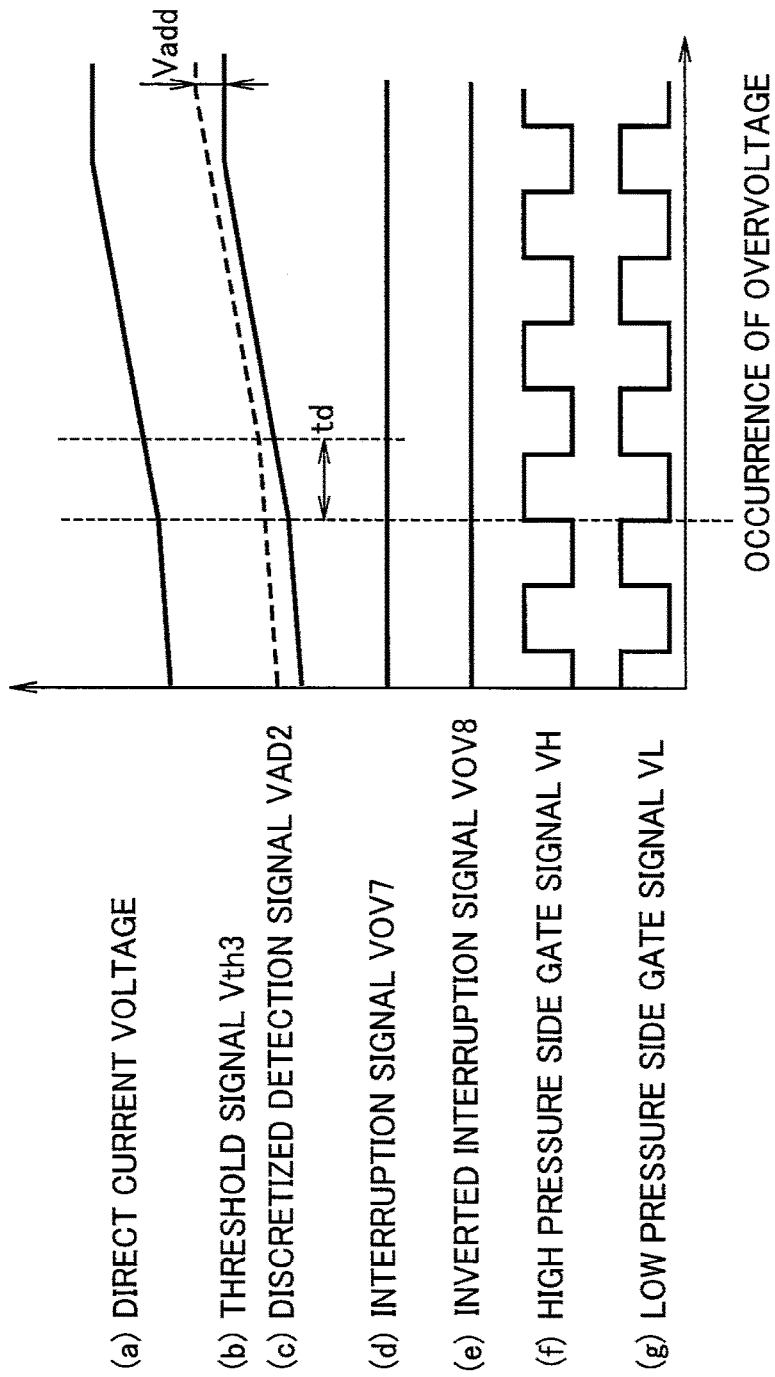
FIG. 13 is a timing chart illustrating the case in which the protection circuit does not operate in the fifth embodiment.

Next, a description will be given on a fifth embodiment with reference to FIGS. 10 to 13. As illustrated in FIG. 10, a protection circuit 51 of the fifth embodiment is provided with the addition circuit 15 of the first embodiment and the output signals of the voltage detection circuit 5 and the addition circuit 15 are inputted to a signal delay comparator 52 As illustrated in FIG. 11, the signal delay comparator 52 is configured by A/D converters AD1 and AD2, a delay time generator 53 that delays the output signal of AD1 for a certain time period, and a signal comparator 54 that compares the output signals of the delay time generator 53 and AD2 and generates an output signal based on the voltage elevation rates of the signals being compared.

Next, a description will be given on the method of detecting an overvoltage. The detection signal Vdet outputted from the voltage detection circuit 5 is inputted to the addition circuit 15 as in the first embodiment, arid a voltage Vplus generated which is a sum of Vdet and a certain amount of voltage Vadd. AD1 takes Vplus as an input signal and generates a discretized voltage signal VAD1. Similarly, AD2 takes Vdet as an input signal and generates VAD2. Further, the delay time generator 53 takes VAD1 as an input signal and generates a threshold signal Vth3 which is delayed for a certain time period such as several is. Vth3 and VAD2 are inputted to the signal comparator 54 and overvoltage detection signal V0V7 is outputted when VAD2 exceeds Vth3.

By employing the above described configuration, it is possible to generate threshold signals without using analog circuitry to allow certain amount of delay time to be added without having to consider variation of element constants and temperature properties and thereby allow stable protection threshold values to be specified.

Other Embodiments

Both of the switching elements SW1 and SW2 may be turned OFF as a protection operation.

In the fourth embodiment, the overvoltage detection results of the protection circuit portions 41(1) and 41(2) may be used simultaneously to output the overvoltage judging signal. In such case, more precise overvoltage detection can be performed while maintaining the speediness of the detection.

Figure 14:
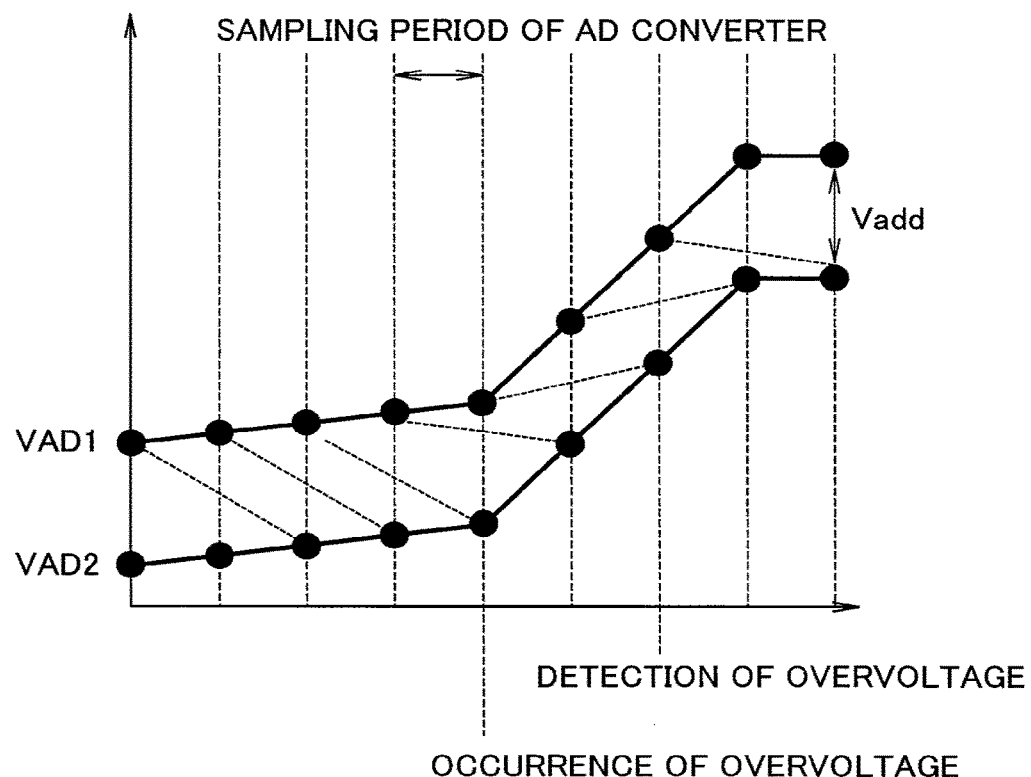
FIG. 14 pertains to another embodiment and illustrates a comparing method of signals.

In the fifth embodiment, an effect which is the same as adding delay time to the threshold signal can be obtained without using the delay time generator 19 by comparing signals VAD1 and VAD2 having different acquisition timings as illustrated in FIG. 14.

Average values may be used for the output signals VAD1 and VAD2 of the A/D converter in the fifth embodiment. In such case, the influence of instantaneous changes in Vdet caused by voltage ripples and electromagnetic noise can be reduced.

The switching unit is not limited to a configuration in which two semiconductor switching elements are series connected. It is sufficient to provide at least one switching element.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

As described above, the power converter of the embodiments may be applied to a configuration in which a protection operation is performed to stop the switching operation when a steep elevation of direct current power supply voltage has been detected.

The invention claimed is:

1. A power converter connected between a direct current power supply and a load, the power converter comprising:
a switching unit protection circuit including:
a switching unit energizing the load based on an inputted control signal,
a voltage detector detecting a voltage of the direct current power supply, and
a protection operation portion detecting a steep elevation of the voltage and performing a protection operation to stop a switching operation of the switching unit,
wherein the protection operation portion includes an addition circuit adding a predetermined voltage to the voltage detected by the voltage detector and an integration circuit connected to an output of the addition circuit, and
wherein the protection operation is performed when a difference between the voltage detected by the voltage detector and an output voltage of the integration circuit reaches a certain value.

2. The power converter according to claim 1, wherein the protection operation portion includes a comparator comparing the voltage detected by the voltage detector and the output voltage of the integration circuit.

3. A power converter connected between a direct current power supply and a load, the power converter comprising:
a switching unit energizing the load based on an inputted control signal,
a voltage detector detecting a voltage of the direct current power supply, and
a protection operation portion detecting a steep elevation of the voltage and performing protection operation to stop a switching operation of the switching unit,
wherein the protection operation portion includes an addition circuit adding a predetermined voltage to the voltage detected by the voltage detector and a delay time generator connected to an output of the addition circuit, and
wherein the protection operation is performed when a difference between the voltage detected by the voltage detector and an output voltage of the delay time generator reaches a certain value.

4. The power converter according to claim 1, wherein the switching unit is configured by two semiconductor switching elements connected in parallel to the direct current power supply, and wherein the protection operation portion causes the switching unit short circuit the load as the protection operation.

5. The power converter according to claim 2, wherein the switching unit is configured by two semiconductor switching elements connected in parallel to the direct current power supply, and wherein the protection operation portion causes the switching unit to short circuit the load as the protection operation.

6. The power converter according to claim 2, wherein the switching unit is configured by two semiconductor switching elements parallelly connected to the direct current power supply, and wherein the protection operation portion causes the switching unit to short circuit the load as the protection operation.

7. The power converter according to claim 1, wherein the protection operation portion includes a logic operator generating drive signal of the switching unit by performing a logical operation of the control signal and a trigger signal generated for performing the protection operation, and wherein the logic operator performs the protection operation with priority over the control signal.

8. The power converter according to claim 2, wherein the protection operation portion includes a logic operator generating a drive signal of the switching unit by performing a logical operation of the control signal and a trigger signal generated for performing the protection operation, and wherein the logic operator performs the protection operation with priority over the control signal.

9. The power converter according to claim 3, wherein the protection operation portion includes a logic operator generating a drive signal of the switching unit by performing a logical operation of the control signal and a trigger signal generated for performing the protection operation, and wherein the logic operator performs the protection operation with priority over the control signal.

10. The power converter according to claim 4, wherein the protection operation portion includes a logic operator generating a drive signal of the switching unit by performing a logical operation of the control signal and a trigger signal generated for performing the protection operation, and wherein the logic operator performs the protection operation with priority over the control signal.

11. The power converter according to claim 5, wherein the protection operation portion includes a logic operator generating a drive signal of the switching unit by performing a logical operation of the control signal and a trigger signal generated for performing the protection operation, and wherein the logic operator performs the protection operation with priority over the control signal.

12. The power converter according to claim 6, wherein the protection operation portion includes a logic operator generating a drive signal of the switching unit by performing a logical operation of the control signal and a trigger signal generated for performing the protection operation, and wherein the logic operator performs the protection operation with priority over the control signal.

* * * * *